United States Patent
Cohen et al.

(10) Patent No.: US 6,310,480 B1
(45) Date of Patent: Oct. 30, 2001

(54) FLOW-THROUGH PROBE FOR NMR SPECTROMETERS

(75) Inventors: Tal Cohen, Herzlia; Naim Levi, Ramat Hasharon; Yair Shur, Kirat Ata; Uri Rapoport, Moshav Ben Shemen, all of (IL)

(73) Assignee: Foxboro NMR LTD, Tirat Hacarmel (IL)

( * ) Notice: Subject to any disclaimer, the term of this patent is extended or adjusted under 35 U.S.C. 154(b) by 0 days.

(21) Appl. No.: 09/394,906

(22) Filed: Sep. 13, 1999

(51) Int. Cl.[7] .................................................. G01V 3/00
(52) U.S. Cl. ........................................... 324/321; 324/318
(58) Field of Search .................................. 324/318, 309, 324/307, 315, 321; 335/216; 62/55.5; 505/163, 231; 428/209, 301.1; 331/94.1

(56) References Cited

U.S. PATENT DOCUMENTS

| | | | |
|---|---|---|---|
| 4,489,275 | 12/1984 | Sancier et al. ................. | 324/315 |
| 4,875,486 | 10/1989 | Rapoport et al. .............. | 415/600 |
| 4,994,746 | 2/1991 | Panosh ........................... | 322/324 |
| 5,136,261 | 8/1992 | Lewis ............................. | 331/94.1 |
| 5,162,734 | 11/1992 | Rapoport ....................... | 307/324 |
| 5,166,620 | 11/1992 | Panosh ........................... | 322/324 |
| 5,184,078 | 2/1993 | Rapoprt .......................... | 321/324 |
| 5,371,464 | 12/1994 | Rapoport ....................... | 306/324 |
| 5,462,791 | * 10/1995 | Kashima et al. ............... | 428/259 |
| 5,552,211 | * 9/1996 | Ackermann et al. ........... | 428/209 |
| 5,552,372 | * 9/1996 | Ackermann et al. ........... | 505/163 |
| 5,571,606 | * 11/1996 | Ackermann et al. ........... | 428/301.1 |
| 5,574,001 | * 11/1996 | Ackermann et al. ........... | 505/231 |
| 5,633,588 | * 5/1997 | Hommei et al. ................ | 324/320 |
| 5,642,625 | * 7/1997 | Cates, Jr. et al. .............. | 62/55.5 |
| 5,691,679 | * 11/1997 | Ackermann et al. ........... | 335/216 |
| 5,759,960 | * 6/1998 | Ackermann et al. ........... | 505/163 |
| 6,002,315 | * 12/1999 | Heiberger et al. ............. | 335/216 |
| 6,037,850 | * 3/2000 | Honmei et al. ................. | 335/216 |

* cited by examiner

Primary Examiner—Jay Patidar
Assistant Examiner—Tiffany A. Fetzner
(74) Attorney, Agent, or Firm—Foley, Hoag & Eliot LLP; Kevin A. Oliver; W. Hugo Liepmann

(57) ABSTRACT

There is disclosed an NMR probe including a body defining an internal chamber. This chamber is adapted for supporting a vacuum and the body is of a non-magnetic material. A conduit extends through the chamber in the body. The conduit has a first portion in communication with second portions, the first portion being intermediate the second portions, with the first and second portions of non-magnetic materials with substantially equal thermal expansion coefficients. An RF coil is positioned along at least a substantial portion of the first conduit portion. It is preferred that this device also include a field or frequency lock unit in the chamber, as well as a getter, to allow for degassing in the chamber to maintain the preferred high pressure vacuum. A method of using this NMR probe for NMR analysis is also disclosed.

15 Claims, 4 Drawing Sheets

FLOW-THROUGH PROBE FOR NMR SPECTROMETERS

FIELD OF THE INVENTION

The invention is directed to nuclear magnetic resonance (NMR) testing apparatus and in particular to probes for NMR spectrometers.

BACKGROUND OF THE INVENTION

Nuclear magnetic resonance (NMR) testing of substances to determine the constituents therein is well known in the art. In known devices, the sample is arranged between the poles of a magnet and is enclosed by a wire coil to enable a sample to be subjected to RF electromagnetic pulses of a predetermined frequency. The resulting NMR pulse generated by the nuclei of the sample under test is detected and processed by the NMR device in a well known manner to identify the sample constituents.

NMR analysis may be performed in devices commonly known as spectrometers. These spectrometers are designed so as to have a probe, that accepts the sample to be analyzed, between poles of a magnet The RF coils and tuning circuitry associated with the probe create a field (B), that rotates the net magnetization of the nucleus. These RF coils also detect the transverse magnetization as it precesses in the X, Y plane. The RF coil pulses the sample nucleus at the Lamor frequency, so as to generate a readable signal for sample identification.

An exemplary probe that performs in accordance with that described immediately above is disclosed in commonly owned U.S. Pat. No. 5,371,464 (Rapoport), and is incorporated by reference herein. This probe, and others like it, while an improvement in the art, still had several disadvantages.

The greatest disadvantage involved temperature changes, particularly temperature increases associated with heating the magnet as a result of the strong thermal conductivity between the sample stream and the magnet itself. This is due mainly to samples that must be run through the stream at high temperatures, so as to remain liquid for analysis, and avoid gelling, solidifying or the like, if cooled. These samples typically dissipate within from the probe, that is transferred through air in the ambient environment, ultimately reaching the magnet and raising its temperature. Heat from the sample may also be transferred by radiating through the ambient environment and can be conducted through the material of the probe itself.

Since magnetic flux is proportional to magnet temperature, the magnet upon heating underwent flux changes. These changes in flux altered the homogeneity of the magnet, and thus the results obtained were inaccurate, and in some cases, worthless.

Even a small change in sample stream temperature was sufficient to cause a major change in the magnetic flux. Frequency locks, such as that disclosed in U.S. Pat. No. 5,166,620 (Panosh), were introduced into probes to counter changes in flux, by controlling the frequency of the RF coils. As for changes in magnetic homogeneity, these can only be made by shimming the magnet.

Today, when magnet control is desired in these systems, complex, highly accurate, heat exchangers are employed with these probes. These heat exchangers are placed in the path of the sample stream prior to its entry into the probe. It has been found that this solution is extremely costly and thus, difficult to implement in in-line process environments.

Additionally, the temperature conductivity between the magnet and the sample stream effects the sample itself With the sample forced to remain in the probe for the desired testing time (period) the sample itself changes as its flow has temporarily ceased during the analysis period. This temperature change can alter NMR test results.

SUMMARY OF THE INVENTION

The present invention improves on the contemporary art by providing a dewer type probe device, that allows for thermal shielding of the sample stream from the magnet. This is accomplished by eliminating heat transfer within the probe. This device is particularly suited for use in in-line process environments.

The device of the present invention is an NMR probe including a body defining an internal chamber. This chamber is adapted for supporting a vacuum and the body is of a non-magnetic material. A conduit extends through the chamber in the body. The conduit has a first portion in communication with second portions, the first portion being intermediate the second portions, with the first and second portions of non-magnetic materials with substantially equal thermal expansion coefficients. An RF coil is positioned along at least a substantial portion of the first conduit portion. It is preferred that this device also include a field or frequency lock unit in the chamber, as well as a getter, to allow for degassing in the chamber to maintain the preferred high pressure vacuum.

BRIEF DESCRIPTION OF THE DRAWINGS

The present invention will be described with reference to the accompanying drawings, wherein like reference numerals or characters identify corresponding or like components. In the drawings.

DETAILED DESCRIPTION OF THE DRAWINGS

Figure 1:
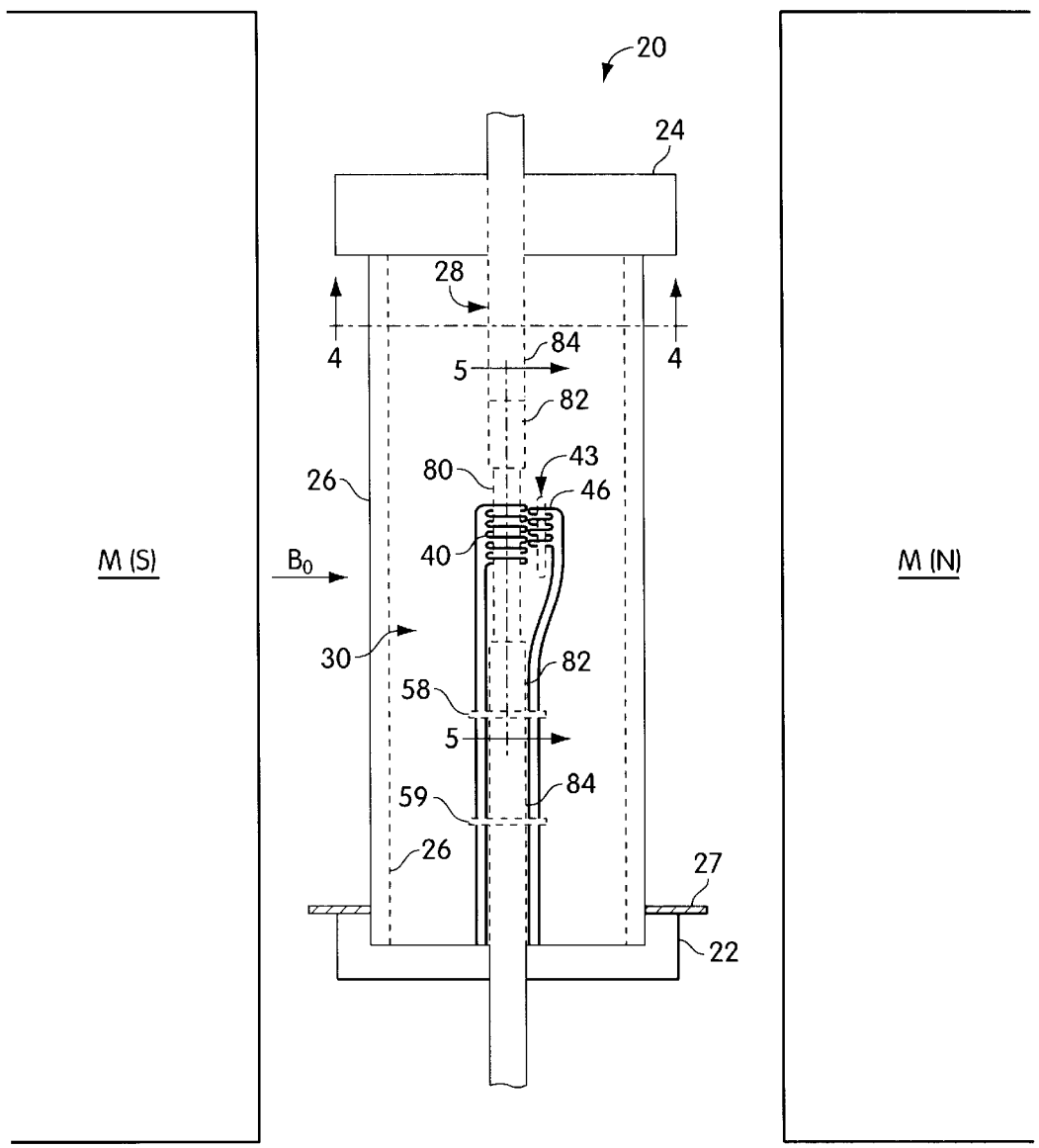
FIG. 1 is a front view of the apparatus of the present invention.

FIG. 1 shows generally the apparatus 20 of the present invention in use with a magnet M (typically having north "N" and south "S" poles), that generates a magnetic field (indicated by the vector Bo). The magnet M is part of an apparatus such as that detailed in U.S. Pat. No. 5,371,464, incorporated by reference herein, designed to accommodate tubular or other similarly shaped probes, such as the apparatus 20 of the present invention.

The apparatus 20 includes a base 22 and a cap 24, that enclose a cylinder 26. The base 22 preferably includes a collar member 27, preferably a separate piece that serves as a heat sink. A conduit 28, through which the fluid to be analyzed passes, extends through the cylinder 26. There is space 30 between the conduit 28 and the inner wall 26a of the cylinder. An RF coil 40 preferably journals the conduit 28 along a non-magnetic, preferably non-metallic, portion of the conduit 28. The cylinder 26 in combination with the base 22 and cap 24, are sealed so as to be air tight, such that when operation is desired, the space 30 therein can be completely evacuated, resulting in an ultra high vacuum (on the order of approximately $10^{-6}$ to $10^{-8}$ torr). The apparatus 20 includes control electronics attached thereto, and are detailed below.

Figure 2:
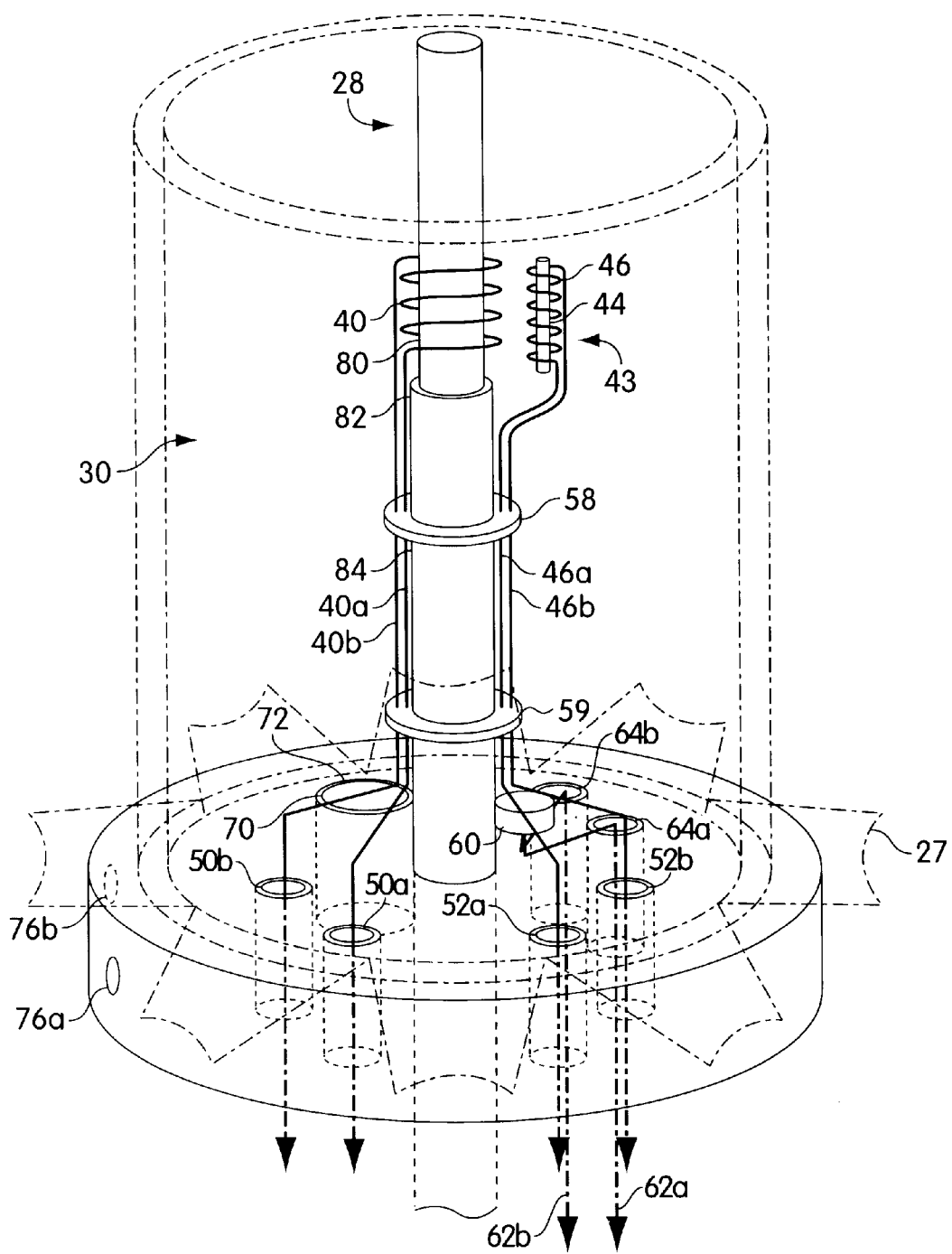
FIG. 2 is a cut away view of the apparatus of the present invention.
Figure 3:
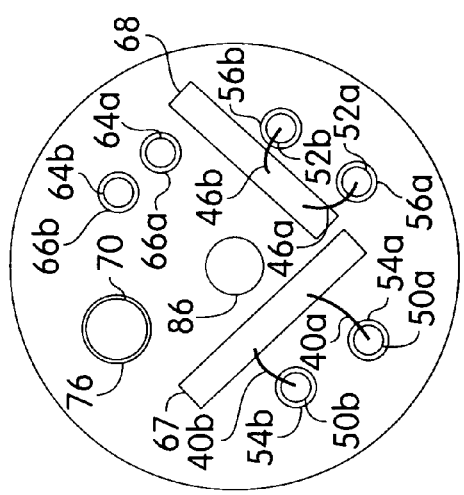
FIG. 3 is a bottom view of the present invention with components removed.

Turning also to FIGS. 2 and 3, the apparatus 20 is shown in greater detail. Field or frequency lock unit or mechanism 43, includes a sealed sample 44 journaled by a field or frequency lock RF coil 46, and associated electronics, is preferably part of the apparatus 20, but is not required. This frequency lock unit 43 is, for example, in accordance with that detailed in commonly owned U.S. Pat. No. 5,166,620 (Panosh), incorporated by reference herein.

RF Coil 40 and frequency lock RF coil 46, terminate in wires 40a, 40b, 46a, 46b, respectively, that connect to the control electronics (detailed below) at feedthroughs 50a, 50b and 52a, 52b. The feedthroughs 50a, 50b, 52a, 52b are positioned in bores 54a, 54b, 56a, 56b in the base 22 by being affixed thereto, so as to form an air-tight seal in their respective bores 54a, 54b, 56a, 56b. The wires 40a, 40b, 46a, 46b are preferably silver plated copper wires, and preferably threaded through, and mounted in, by welds with non-magnetic materials, proportionally sized openings in guides 58, 59. These guides 58, 59 are preferably of a ceramic or non-magnetic and non-conductive material, and attached along the conduit 28, at points where the portions forming the conduit 28 attach, and serve to keep the wires 40a, 40b, 46a, 46b properly aligned, so as not to touch each other.

A getter 60, such as getters of Type St172 Standard Getters, and preferably of type ST172/HI/7-6/150C, Manufacture Code 5K0350, from Saes Getters, Via Gallatate 215, Milan 20151, Italy, is employed to maintain the vacuum, in particular the high vacuum, in the space 30 of the apparatus 20. The getter, as well as any other getter employed, is preferably in the form of a cylinder or the like (although other shapes, e.g. square, rectangle, polygonal, triangular, oval, etc., are also permissible). The getter 60 is connected by wires 62a, 62b to feedthroughs 64a, 64b mounted in an air-tight manner in bores 66a, 66b, similar to the feedthroughs 50a, 50b, 52a, 52b detailed above. The getter 60 is configured for receiving a voltage, typically approximately 5 volts, through the wires 62a, 62b (in accordance with the wires 40a, 40b, 46a, 46b above), to absorb molecules (typically gases) formed in the apparatus as components undergo "degassing" over time, and therefore, maintain the vacuum at the preferred level (detailed above). While a single getter 60 is shown, multiple getters are also permissible.

The feedthroughs 50a, 50b, 52a, 52b, 64a, 64b, are preferably made of materials such as KOVAR brand alloyed metal (CRS Holdings, Inc., Wilmington, Del.), in a cylinder or the like for surrounding the wires. KOVAR is preferred as it has a thermal expansion coefficient similar to that of the material of the base 22, and can be mounted in an air tight manner in the bores 54a, 54b, 56a, 56b, 66a, 66b of the base 22. Other materials are also sufficient provided they have suitable thermal expansion coefficients with respect to that of the material of the base. Other feedthrough shapes, e.g. square, rectangle, polygonal, triangular, oval, etc., are also permissible provided the bores 54a, 54b, 56a, 56b, 66a, 66b of the base 22 are correspondingly shaped.

The wires 40a, 40b, 46a, 46b, 62a, 62b extend through the respective feedthroughs 50a, 50b, 52a, 52b, 64a, 64b, with wires 40a, 40b, 46a, 46b connecting to the control electronics, that are partially on lands 67, 68. Each land 67, 68 typically corresponds to control electronics for the RF coil 40 and frequency lock RF coil 46, respectively. Wires 62a, 62b are adapted to connect with and receive voltages from external sources, to supply voltage to the getter 60, when operation thereof is desired.

A pipe 70 is mounted in an opening 72 in the base 22, also in an air tight manner, similar to the feedthroughs 50a, 50b, 52a, 52b, 64a, 64b above. The pipe 70 is adapted for connection to a suction source for providing vacuum evacuation, and is of a material that can be pinched (e.g., crimped) and sealed, typically by brazing (in accordance with that detailed below) or the like, so as to maintain the vacuum. This pipe 70 is preferably made of Copper, but can also be of other materials such as Aluminum or other materials, preferably metals that are soft, so as to be crimped and brazed closed (by brazing operations such as that detailed below) in an air-tight manner, in order to hold the vacuum at the desired high level.

The base 22 may also include connection ports 76a, 76b (in broken lines), such as SMA, for example, Part No. 2006-5010-00 from MA COM, Massachusetts, for permitting connections to the control electronics, in particular, those electronics located on the lands 67, 68, by cables, wires or the like. There are typically at least two connection ports 76a, 76b, one for each of the main RF coil 40 and field or frequency lock RF coil 46. The cap 24 is similar to the base 22, but typically does not include bores for feedthroughs and pipes, as detailed above. However, if desired, these structures may be present in the cap 24.

The base 22 and cap 24 are made of non-magnetic materials, preferably non-magnetic metals such as stainless steel. Other metals such as Molybdinum, Titanium, etc. are also suitable. The base 22 and cap 24 may be made of the same or different materials.

Figure 4:
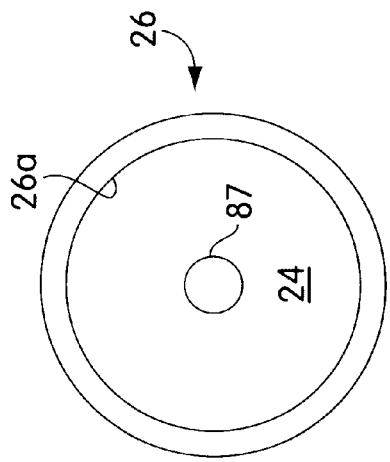
FIG. 4 is a cross-sectional view of the present invention, taken along line 4—4 of FIG. 1.

As shown in FIG. 4, which represents the cross-sectional view 4—4 of FIG. 1, the cylinder 26 is preferably made of materials such as Molybdenum brazed to stainless steel, and it preferred that its inner wall 26a be shiny, so as to be highly reflective. It is preferred to make this inner wall shiny by techniques such as electro-polishing followed by ultrasonic cleaning. While the base 22, cap 24 and cylinder 26 are shown as circular and cylindrical respectively, they may be of other shapes such as squared (rectangular), triangular, etc. The base 22, cap 24, and cylinder 26 are preferably joined together by techniques such as brazing or welding, such that they are sealed in an air-tight manner, so as to be able to support the desired ultra high vacuum in the space 30.

The brazing operation preferably uses Palciul 10 or Gapasil 9 as the brazing material, with the brazig process done under vacuum conditions. In one exemplary brazing operation, there is a pumping down for approximately 10 minutes at approximately 700C and then raising the temperature to 930C for another 10 minutes. The welding operation preferred is TIG welding and for example may be performed with a TIG welder with a 0.020 electrode on a 35–40 setting.

Figure 5:
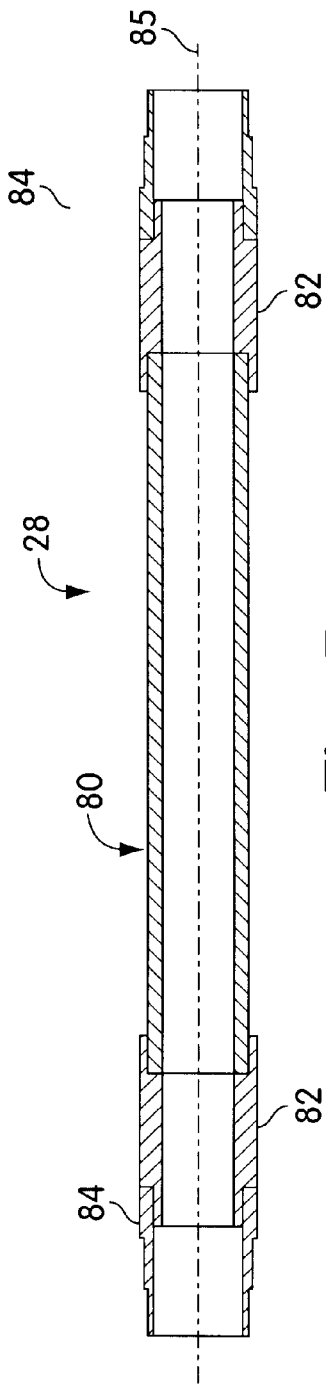
FIG. 5 is a cross-sectional view of the present invention, taken along line 5—5 of FIG. 1.

The conduit 28 is detailed in FIG. 5 (which represents the cross-sectional view 5—5 of FIG. 1), which will now be described in conjunction with FIGS. 1–3. The conduit 28 includes an analysis portion or tube 80, with adapters 82 attached at both ends. These adapters 82 are in turn attached to tube portions 84, that form the remainder of the conduit 28. It is preferred that these conduit portions 80, 82, 84 be aligned so as to be coaxial (along the axis 85). The attachments are preferably male-female type fits and have been joined together by techniques such as brazing (detailed above). Other fits are joining methods are also permissible. While a round or cylindrical conduit is shown, it could also be other shaped such as square (rectangular) triangular, polygonal, etc.

The analysis portion or tube 80 is preferably a ceramic tube, of a ceramic material such a Alumina, for example Alumina 96% or AL 23, available from Frialit-Degussit, Postfach 71 02 61, D-68222, Manhem, Germany, that can hold fluids at high pressures and temperatures. Other non-magnetic, non-metallic materials, such as glass and sapphire are also suitable provided they are treated to hold fluids at high pressures. The tube 80 is such that the RF coil 40 can be placed around it, so as to journal it, in either a contacting or non-contacting manner, or combinations thereof (contacting and non-contacting portions). The tube 80 forms the "male" portion of the male-female fit, with the respective adapters 82. The tube 80 is preferably connected to the respective adapters 82 by techniques such as brazing, as detailed above.

The adapters 82, are preferably tubular pieces of materials, preferably metals such as titanium. Titanium is preferred because it has a thermal expansion coefficient similar to that of the ceramic, an in particular Alumina. Other materials may also form these adapters 82, provided they have similar thermal expansion coefficients with respect to the material of the tube 80. The adapters 82 forms the "male" portion of the male-female fit, with the respective tube portions 84.

The tube portions 84 are preferably stainless steel or other similar non-magnetic material, and are preferably connected to the respective adapters 82, by techniques such as brazing or welding (as detailed above). The tube portions 84 extend through bores 86, 87 in the base 22 and cap 24 respectively, and are sealed in an air-tight manner (as detailed above), so as to preserve the vacuum in the apparatus 20. It is also preferred that the material for the tube portions 84 be of a thermal expansion coefficient similar to that of the tube 80 and adapters 82.

With respect to all of the materials that form the above listed components of the apparatus 20, all of these materials are selected as they degas minimally, if at all, and thus, can hold a passive vacuum for long time periods, typically on the order of years.

Figure 6:
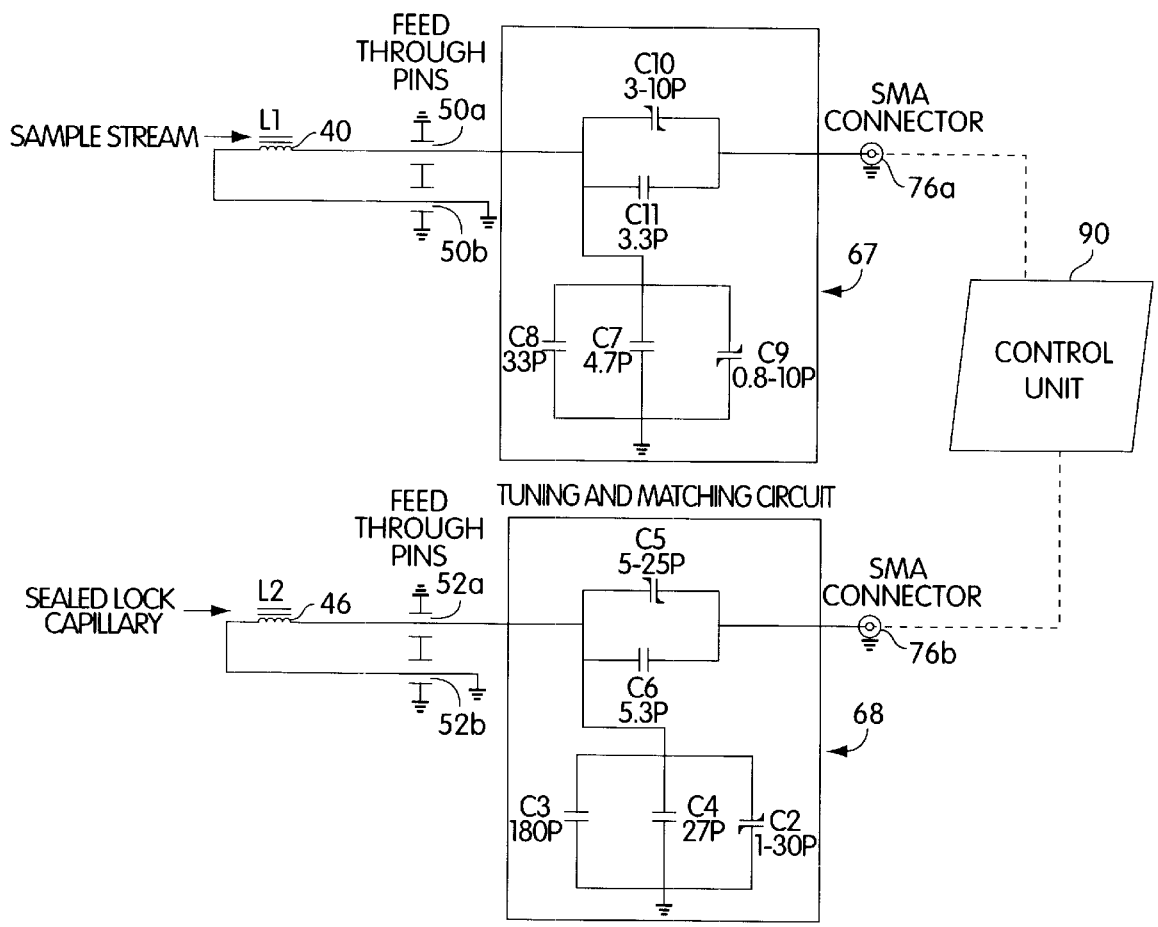
FIG. 6 is a schematic of the components of the present invention.

FIG. 6 details the control electronics, and in particular, the control electronics lands 67, 68 for the corresponding RF coil 40 and the frequency lock RF coil 46. These control electronics lands 67 and 68 are such that they contain tuning and matching circuitry, intermediate the respective coils 40, 46 and SMA connectors 76a, 76b, that are preferably connected to a control unit 90, for example a microprocessor, CPU, personal computer, or other computer or similar type device, for controlling the RF Coil 40 and field or frequency lock RF coil 46 in a coordinated manner, with hardware, software or combinations thereof. This tuning and matching circuitry functions to tune the RF coil 40 as a high frequency antenna, and match it to an approximately 50 ohm impedance.

The tuning and matching circuitry on land 67 includes a series of networked capacitors C7–C11. Capacitors C7, C8 and C11 are High Q chip capacitors and here for example, are of capacitances of 4.7 picofarads (PF), 33 PF and 3.3 PF, respectively. Capacitors C9 and C10 are variable 0.8–10 PF and 3–10 PF, respectively, High Q chip capacitors.

The tuning and matching circuitry on land 68 includes a series of networked capacitors C2–C6. Capacitors C3, C4 and C6 are High Q chip capacitors and here for example, are of capacitances of 180 PF, 27 PF and 5.3 PF, respectively. Capacitors C2 and C5 are variable 1–30 PF and 5–25 PF High Q chip capacitors.

In operation, the apparatus 20 is placed inside a magnet, such as that detailed in U.S. Pat. No. 5,371,464. Cables are then connected to the SMA connectors 76a, 76b and the apparatus 20 is evacuated to a preferred vacuum of approximately $10^{-6}$ to $10^{-8}$ torr, with the pipe 70, crimped and sealed by techniques such as brazing (as detailed above). The sample is then entered into the apparatus 20, and may either flow through the analysis portion or tube 80 or may remain in a non-flowing manner in the analysis portion or tube 80, when NMR analysis is occurring. The NMR analysis, including operation of the RF coil 40 and frequency lock RF coil 46, including pulse sequence protocols, is in accordance with conventional NMR analysis.

While preferred embodiments of the present invention have been described, so as to enable one of skill in the art to practice the present invention, the preceding description is intended to be exemplary only. It should not be used to limit the scope of the invention, which should be determined by reference to the following claims.

What is claimed is:

1. An NMR probe comprising:
   a body, said body defining an internal chamber, said chamber adapted for supporting a vacuum, said body of a non-magnetic material;
   a conduit extending through said chamber in said body, said conduit having a first portion in communication with second portions, said first portion intermediate said second portions, said first and second portions of non-magnetic materials with substantially equal thermal expansion coefficients; and
   an RF coil positioned along at least a substantial portion of said first conduit portion.

2. The probe of claim 1, additionally comprising a frequency lock unit, said frequency lock unit in operative communication with said RF coil.

3. The probe of claim 1, additionally comprising at least one getter.

4. The probe of claim 1, wherein said first conduit portion includes a ceramic tube.

5. The probe of claim 1, wherein said chamber of said body is adapted to support a vacuum of approximately $10^{-6}$ to $10^{-8}$ torr.

6. The probe of claim 1, wherein said conduit includes third portions intermediate said first and second portions, said third portions of a non-magnetic material, and of a substantially equal thermal expansion coefficients to said first conduit portion.

7. The probe of claim 4, wherein said ceramic is alumina.

8. The probe of claim 1, wherein said first conduit portion comprises a tube of a material selected from the group comprising: alumina, glass and sapphire.

9. The probe of claim 7, wherein said second portions include stainless steel.

10. The probe of claim 6, wherein said first portion is comprised of alumina, said second portions are comprised of stainless steel, and said third portions are comprised of titanium.

11. The probe of claim 1, wherein said body is cylindrical.

12. The probe of claim 1, wherein said conduit is cylindrical.

13. The probe of claim 3, wherein said RF coil is in operative communication with said at least one getter.

14. The probe of claim 11, wherein said body is made of materials selected from the group comprising: Stainless steel, Molybdenum, titanium or combinations thereof.

15. The probe of claim 11, wherein said inner walls of said cylindrical body are reflective.

\* \* \* \* \*